(12) United States Patent
Chen

(10) Patent No.: US 7,446,452 B2
(45) Date of Patent: Nov. 4, 2008

(54) SURFACE ACOUSTIC WAVE DEVICE

(75) Inventor: Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 58 days.

(21) Appl. No.: 11/473,982

(22) Filed: Jun. 23, 2006

(65) Prior Publication Data
US 2007/0085446 A1    Apr. 19, 2007

(30) Foreign Application Priority Data
Oct. 19, 2005    (CN)    ......................... 2005 1 0100556

(51) Int. Cl.
*H01L 41/083* (2006.01)
(52) U.S. Cl. .................................. 310/313 R
(58) Field of Classification Search ............... 310/313 R
See application file for complete search history.

(56) References Cited

U.S. PATENT DOCUMENTS

| | | | | |
|---|---|---|---|---|
| 5,565,724 | A | * | 10/1996 | Hachigo et al. ......... 310/313 A |
| 6,469,416 | B1 | | 10/2002 | Itakura et al. |
| 6,713,941 | B2 | | 3/2004 | Itakura et al. |
| 2002/0027485 | A1 | * | 3/2002 | Shin ........................... 333/193 |
| 2003/0137217 | A1 | * | 7/2003 | Ishibashi et al. ......... 310/313 R |
| 2004/0189425 | A1 | * | 9/2004 | Iwashita et al. ............. 333/193 |

* cited by examiner

Primary Examiner—J. SanMartin
Assistant Examiner—Derek J Rosenau
(74) Attorney, Agent, or Firm—Andrew C. Cheng

(57) ABSTRACT

An exemplary surface acoustic wave device includes a DLC film, a zinc oxide film formed on the DLC film, and at least one interdigital transducer formed on the zinc oxide film. The DLC film has a nano-sized thickness Z(f), corresponding to the surface acoustic wave device having an operational frequency f ranging from 20 to 1,000 GHz, satisfying the condition (1): $Z(f)=M \times Z_0/(f/f_0)$, and $Z(f) \geq 1$ nanometer. The zinc oxide film has a nano-sized thickness Y(f), corresponding to the surface acoustic wave device having the operational frequency f, satisfying the condition (2): $Y(f)=N \times Y_0/(f/f_0)$. The $Z_0$ and $Y_0$ respectively are the thicknesses of the DLC film and the zinc oxide film corresponding to an operational frequency $f_0$ of the surface acoustic wave device.

4 Claims, 1 Drawing Sheet

SURFACE ACOUSTIC WAVE DEVICE

TECHNICAL FIELD

This invention relates generally to surface acoustic wave devices that have excellent operational performance at frequency ranges such as gigahertz and higher-frequency bands.

BACKGROUND

A surface acoustic wave device is electromechanical conversion device and relies on a surface acoustic wave that propagates its elastic energy concentrated at the surface of a solid. Generally, a surface acoustic wave device is provided with at least one interdigital transducer on a piezoelectric substrate. The interdigital transducer includes a pair of comb-like electrodes interdigitated with each other and each having a plurality of digit electrodes. When an electrical signal is applied on the at least one interdigital transducer of the surface acoustic wave device, the piezoelectric substrate is stressed, and this stress becomes a surface acoustic wave. Then, the surface acoustic wave propagates on the surface of the piezoelectric substrate. Operational frequency f of the surface acoustic wave device is defined by $f=\upsilon/\lambda$, wherein $\upsilon$ is a propagation velocity of the surface acoustic wave and $\lambda$ is a wavelength of the surface acoustic wave device which is determined by a distance across one cycle of the digit electrodes.

Nowadays, surface acoustic wave devices are widely used in wireless communication apparatuses such as mobile cellular phones, broadcasting satellites and so on. However, conventional surface acoustic wave devices generally have operational frequencies of less than 10 gigahertz. With the development of wireless communication technologies, mobile cellular phones and broadcasting satellites are likely to use higher frequencies for carrier waves. Therefore, surface acoustic wave devices can be used at a frequency band more than 10 gigahertz have been required.

What is needed is to provide a surface acoustic wave device which can be used at a higher-frequency band.

SUMMARY

A preferred embodiment provides a surface acoustic wave device including: a diamond-like carbon film, a zinc oxide film formed on the diamond-like carbon film, and at least one interdigital transducer formed on the zinc oxide film. The diamond-like carbon film has a nano-sized thickness of $Z(f)$, corresponding to the surface acoustic wave device having an operational frequency f ranging from 20 to 1,000 gigahertz, satisfying the condition (1): $Z(f)=M \times Z_0/(f/f_0)$, and $Z(f) \geqq 1$ nanometer; where $Z_0$ is a thickness of the diamond-like film when the operational frequency of the surface acoustic wave device is equal to $f_0$; M is in the range from 1 to 15. The zinc oxide film has a nano-sized thickness $Y(f)$, corresponding to the surface acoustic wave device having the operational frequency f, satisfying the condition (2): $Y(f)=N \times Y_0/(f/f_0)$; where $Y_0$ is a thickness of zinc oxide film when the operational frequency of the surface acoustic wave device is equal to $f_0$; N is in the range from 1 to 1.5.

Other advantages and novel features will become more apparent from the following detailed description of embodiments when taken in conjunction with the accompanying drawings.

BRIEF DESCRIPTION OF THE DRAWINGS

Many aspects of the present surface acoustic wave device can be better understood with reference to the following drawings. The components in the drawings are not necessarily drawn to scale, the emphasis instead being placed upon clearly illustrating the principles of the present surface acoustic wave device. Moreover, in the drawings, like reference numerals designate corresponding parts throughout the several views.

The exemplifications set out herein illustrate at least one preferred embodiment, in one form, and such exemplifications are not to be construed as limiting the scope of the present surface acoustic wave device in any manner.

DETAILED DESCRIPTION OF PREFERRED EMBODIMENTS

Figure 1:
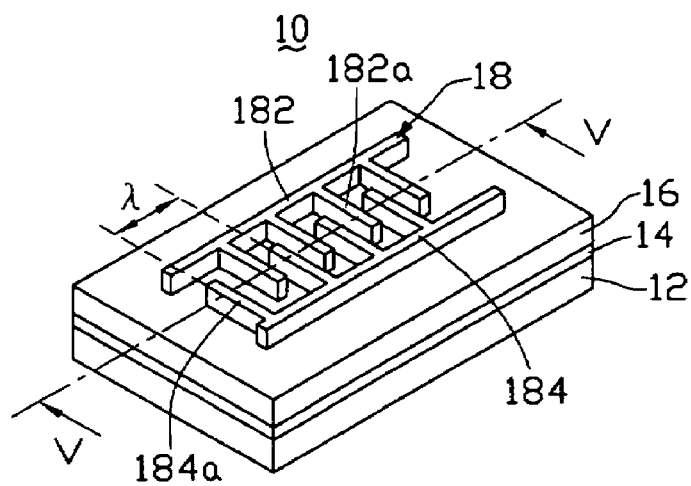
FIG. 1 is an isometric view of a surface acoustic wave device in accordance with a preferred embodiment.

Referring to FIG. 1, a surface acoustic wave (hereinafter referred to as SAW) device 10 in accordance with a preferred embodiment is shown. The SAW device 10 includes a diamond-like carbon (hereinafter referred to as DLC) film 14, a zinc oxide film 16 formed on the DLC film 14, and an interdigital transducer 18 formed on the zinc oxide film 16.

The DLC film 14 is formed on a non-piezoelectric substrate 12. Alternatively, the DLC film 14 can be formed individually without using the non-piezoelectric substrate 12. The non-piezoelectric substrate 12 can be made of silicon (Si), glass, silicon carbide (SiC), silicon nitride ($Si_3N_4$), alumina ($Al_2O_3$), magnesia (MgO), gallium nitride (GaN), and so on. The DLC film 14 usually has a propagation velocity of no less than 10,000 meters per second (m/sec). The DLC film 14 has a nano-sized (typically, no more than 100 nanometers) thickness $Z(f)$. In general, the thickness of the DLC film 14 is decreased as the operational frequency of the SAW device 10 increases. Preferably, when the SAW device 10 has an operational frequency f ranging from 20 to 1,000 gigahertz (GHz), the DLC film 14 has the thickness $Z(f)$ satisfying the following condition (1):

$$Z(f)=M \times Z_0/(f/f_0), \text{and } Z(f) \geqq 1 \text{ nanometer(nm)}; \quad (1)$$

where $Z_0$ is a thickness of the SAW device 10 corresponding to an operational frequency $f_0$ of the SAW device 10; and M is in the range from 1 to 15.

Referring to Table 1 below, an exemplary relationship between the thickness $Z_0$ of the DLC film 14 and the operational frequency $f_0$ of the SAW device 10 is shown. It is noted that in the illustrated embodiment: as shown in Table 1, values of $f_0$ are in the range from 20 to 1,000 GHz and values of $Z_0$ are in the range from 1 to 20 nanometers correspondingly, preferably in the range from 5 to 20 nanometers. It is understood that the $f_0$ and corresponding $Z_0$ also can be a set of data composed of f and Z(f) calculated from the condition (1).

The zinc oxide film 16 is composed of $ZnO_x$, wherein the x is a mole ratio (i.e. atomic ratio) of oxygen to zinc. X is usually in the range from 0.8 to 2.5, preferably, in the range from 1 to 2. The zinc oxide film 16 has a nano-sized thickness Y(f). In general, the thickness of the zinc oxide film 16 is decreased as the operational frequency of the SAW device 10 increases. Preferably, when the SAW device 10 has the operational frequency f, the zinc oxide film 16 has the thickness Y(f) satisfying the following condition (2):

$$Y(f)=N \times Y_0/(f/f_0); \quad (2)$$

where $Y_0$ is a thickness of the SAW device 10 corresponding to the operational frequency $f_0$ of the SAW device 10; and N is in the range from 1 to 1.5.

Referring to Table 1 below, an exemplary relationship between the thickness $Y_0$ of the zinc oxide film 16 and the operational frequency $f_0$ of the SAW device 10 is shown. It is noted that in the illustrated embodiment: values of $f_0$ are in the range from 20 to 1,000 GHz and values of $Y_0$ are in the range from 1 to 60 nanometers correspondingly. It is understood that the $f_0$ and corresponding $Y_0$ also can be a set of data composed of f and Y(f) calculated from the condition (2).

TABLE 1

| $Z_0$ | | 5~20 | | | 5~10 | | 2~5 | | 1~5 |
|---|---|---|---|---|---|---|---|---|---|
| $Y_0$ | 50~60 | 25~30 | 17~20 | 12.5~15 | 10~12 | 5~6 | 2.5~3 | 2~2.4 | 1~1.2 |
| $f_0$ | 20 | 40 | 60 | 80 | 100 | 200 | 400 | 500 | 1000 |

The interdigital transducer 18 includes a pair of comb-like electrodes 182 and 184. The comb-like electrodes 182 and 184 are interdigitated with each other and each has a plurality of digit electrodes 182a, 184a. The digit electrodes 182a, 184a usually have a same cycle λ, as denoted in FIG. 1. When an electrical signal is applied on the interdigital transducer 18 (i.e. the pair of comb-like electrodes 182 and 184) formed on the zinc oxide film 16, the zinc oxide film 16 is stressed and this stress excites a surface acoustic wave. The surface acoustic wave can propagate its elastic energy along a direction substantially parallel to the arrangement direction of the digit electrodes 182a or 184a. The surface acoustic wave has a wavelength determined by and usually equal to the cycle λ.

In the illustrated embodiment, the SAW device 10 includes one interdigital transducer 18, and the SAW device 10 is a one-port surface acoustic wave resonator correspondingly. It is understood to the skilled person in the art, the SAW device 10 can be equipped with two or more interdigital transducers 18, and correspondingly the SAW device 10 can act as a filter which can be used in the wireless communication field.

A method for manufacturing such a SAW device 10 will be described below in detail with reference to FIGS. 2 through 5.

Figure 2:
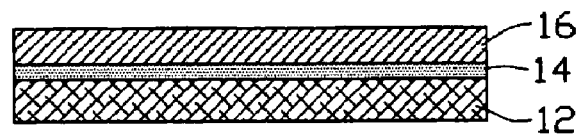
FIG. 2 is a schematic, cross-sectional view of a stage of a method for manufacturing the surface acoustic wave device of FIG. 1, showing a non-piezoelectric substrate, a diamond-like carbon film formed on the substrate, and a zinc oxide film formed on the diamond-like carbon film.

Referring to FIG. 2, a multi-layer structure including a non-piezoelectric substrate 12, a DLC film 14 and a zinc oxide film 16 are provided. The DLC film 14 is sandwiched between the non-piezoelectric substrate 12 and the zinc oxide film 16. The formation of the multi-layer structure is actually the result of a series of sub-steps. The non-piezoelectric substrate 12, consisting of, for example, a silicon substrate, is first provided. The DLC film 14 is deposited on the non-piezoelectric substrate 12 by way of a radio frequency (RF) magnetron reactive sputtering with a gas mixture and a target of graphite or carbon block. The gas mixture may be a mixture of argon and methane ($CH_4$), or argon and hydrogen gas ($H_2$), or argon and ethane ($C_2H_6$). The zinc oxide film 16 is deposited on the DLC film 14 by way of a direct current (DC) magnetron reactive sputtering with a gas mixture of argon and oxygen gas and a target of zinc, an atomic ratio of oxygen to zinc in the zinc oxide film 16 can be adjusted by controlling the flow rate of the oxygen gas. The thicknesses of the DLC film 14 and the zinc oxide film 16 is determined by the operational frequency of the resultant SAW device 10.

Figure 3:
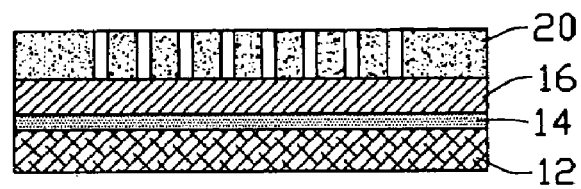
FIG. 3 is a schematic, cross-sectional view of a subsequent stage of the manufacturing method, showing a masking layer being formed on the zinc oxide film of the FIG. 2.

Referring to FIG. 3, a masking layer 20 is formed on the zinc oxide film 16. The masking layer 20 has a reverse pattern corresponding to a pattern of the interdigital transducer 18 of the resultant SAW device 10. The formation of the masking layer 20 is actually the result of a series of sub-steps. A photo-resist substance is spin-coated onto the zinc-oxide film 16 to form a photo-resist layer. A photo-mask (not shown) with a identical to the pattern of the interdigital transducer 18 of the resultant SAW device 10 is disposed on the photo-resist layer for exposing the photo-resist layer by a ultraviolet (UV) or a deep UV exposure. The pattern of the photo-mask is developed in the exposed photo-resist layer and thereby the masking layer 20 is formed.

Figure 4:
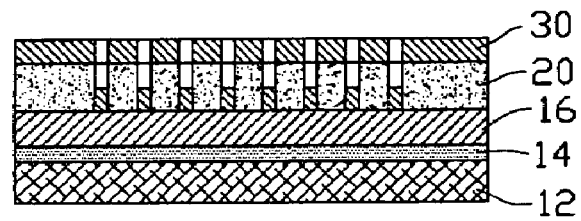
FIG. 4 is a schematic, cross-sectional view of a further subsequent stage of the manufacturing method, showing a metal layer being formed on the masking layer of the FIG. 3.

Referring to FIG. 4, a metal layer 30 is formed by a sputtering process. In detail, a part of the metal layer 30 is formed on the masking layer 20, and the other part of the metal layer 30 is formed in the pattern of the masking layer 20 and in tight contact with the zinc oxide film 16. The metal layer 30 may be composed of gold (Au), aluminum (Al), copper (Cu), or silver (Ag).

Figure 5:
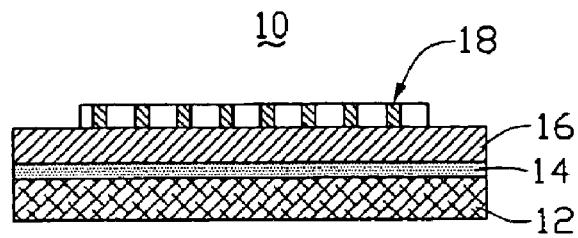
FIG. 5 is a schematic, cross-sectional view of an even further subsequent stage of the manufacturing method and taken along the line V-V of FIG. 1, showing the masking layer of FIG. 4 being removed.

Referring to FIG. 5, the masking layer 20 is etched and removed, and then the part of the metal layer 30 formed on the masking layer 20 is stripped off. The other part of the metal layer 30 which is in tight contact with the zinc oxide film 16, is left untouched and thereby the interdigital transducer 18 having a resultant pattern is formed. Consequently, a resultant SAW device 10 is obtained.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the present invention.

What is claimed is:

1. A surface acoustic wave device, comprising:
   a diamond-like carbon film with a nano-sized thickness represented by $Z_0$ ranging from 1 to 20 nanometers, corresponding to the surface acoustic wave device having an operational frequency represented by $f_0$ ranging from 20 to 1000 gigahertz;
   a zinc oxide film formed on the diamond-like carbon film, the zinc oxide film having a nano-sized thickness represented by $Y_0$ ranging from 1 to 60 nanometers, corresponding to the surface acoustic wave device having the operational frequency ranging from 20 to 1000 gigahertz; and at least one interdigital transducer formed on the zinc oxide film.

2. The surface acoustic wave device of claim 1, wherein the zinc oxide film is composed of ZnOx, where x is an atomic ratio of oxygen to zinc ranging from 0.8 to 2.5.

3. The surface acoustic wave device of claim 2, wherein x is in the range from 1 to 2.

4. The surface acoustic wave device of claim 1, wherein $Z_0$, $Y_0$ and $f_0$ each has a value selected from the following table:

| $Z_0$ | | 5~20 | | | 5~10 | | 2~5 | | 1~5 |
|---|---|---|---|---|---|---|---|---|---|
| $Y_0$ | 50~60 | 25~30 | 17~20 | 12.5~15 | 10~12 | 5~6 | 2.5~3 | 2~2.4 | 1~1.2 |
| $f_0$ | 20 | 40 | 60 | 80 | 100 | 200 | 400 | 500 | 1000 | the units of $Z_0$, $Y_0$ and $f_0$ respectively being nanometers, nanometers and gigahertz.

* * * * *